(12) United States Patent
Tanabe

(10) Patent No.: US 8,305,151 B2
(45) Date of Patent: Nov. 6, 2012

(54) RESONANCE TYPE OSCILLATION CIRCUIT AND SEMICONDUCTOR DEVICE

(75) Inventor: Akira Tanabe, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 41 days.

(21) Appl. No.: 12/926,129

(22) Filed: Oct. 27, 2010

(65) Prior Publication Data
US 2011/0109396 A1    May 12, 2011

(30) Foreign Application Priority Data

Nov. 9, 2009    (JP) ................................. 2009-256494

(51) Int. Cl.
*H03B 5/12*    (2006.01)
(52) U.S. Cl. ................................. 331/117 FE; 331/36 L
(58) Field of Classification Search ............... 331/36 C, 331/36 L, 117 FE, 117 R, 167
See application file for complete search history.

(56) References Cited

U.S. PATENT DOCUMENTS

| | | | | |
|---|---|---|---|---|
| 6,232,847 | B1 * | 5/2001 | Marcy et al. | 331/167 |
| 6,992,532 | B2 * | 1/2006 | Christensen | 331/117 FE |
| 7,554,416 | B2 * | 6/2009 | Lee et al. | 331/115 |
| 7,592,875 | B2 * | 9/2009 | Maget et al. | 331/46 |
| 2007/0146088 | A1 | 6/2007 | Arai et al. | |

FOREIGN PATENT DOCUMENTS

| | | |
|---|---|---|
| JP | 2002-319624 A | 10/2002 |
| JP | 2007-174552 A | 7/2007 |

* cited by examiner

*Primary Examiner* — Levi Gannon
(74) *Attorney, Agent, or Firm* — McGinn IP Group, PLLC

(57) ABSTRACT

A resonance type oscillation circuit includes an inductance element which is connected between a first terminal and a second terminal, an amplifier circuit which is connected in parallel with the inductance element between the first terminal and the second terminal, and a first capacitance element which is connected between the first terminal and the second terminal. The oscillation circuit further includes a pair of lead-out regions which are provided on the way of one end and the other end of the inductance element, a switch element which is connected between the pair of lead-out regions and provides short-circuit between the pair of lead-out regions when the switch element is on, and a second capacitance element which is connected between the pair of lead-out regions in parallel with the switch element.

19 Claims, 11 Drawing Sheets

RESONANCE TYPE OSCILLATION CIRCUIT AND SEMICONDUCTOR DEVICE

TECHNICAL FIELD

Reference to Related Application

This application is based upon and claims the benefit of the priority of Japanese patent application No. 2009-256494, filed on Nov. 9, 2009, the disclosure of which is incorporated herein in its entirety by reference thereto.

This invention relates to an oscillation circuit and a semiconductor device, and particularly to a resonance type oscillation circuit which makes the oscillation frequency variable, and a semiconductor device in which the oscillation circuit is formed on a semiconductor substrate.

BACKGROUND

In recent years, various high speed digital wireless methods including a cellular phone, a wireless LAN, a Bluetooth and a digital terrestrial TV etc. have been put into practical use. Analog technologies similar to those in the wireless circuits are also used in semiconductor integrated circuits which perform digital signal processing, and particularly in the circuits which operate at a high speed more than GHz. In those circuits, on-chip inductors which are formed on a semiconductor substrate are used as a passive component. This inductor has a constitution in which a metal wire is coiled in a spiral pattern on the semiconductor.

This type of on-chip inductor is often used as part of a resonance circuit in analog circuits. The resonance circuit is resonated by connecting an inductor(s) and a capacitor(s) in series or parallel. The resonance frequency f0 is determined by an inductance value L of the inductor and a capacitance value C of the capacitor as shown in Equation (1).

$$f_0 = \frac{1}{2\pi\sqrt{LC}} \quad (1)$$

The resonance circuit produces effects in which it has a high gain and an impedance matching and oscillates etc. at the resonance frequency f0. However, since this type of resonance occurs only at a narrow band frequency near the resonance frequency, it is necessary to vary the resonance frequency in order to produce a circuit which is capable of operating at various frequencies. To this end, L or C has to be varied. FIG. 9 shows an amplifier example using this resonance circuit, and a load including inductor L31 and capacitor C31 is connected to MISFET M31 as shown in the FIG. 9. Gm is referred to as a transconductance of M31, and R31 is referred to as a series resistance of the inductor, and by neglecting a series resistance of the capacitor and a parasitic capacitance(s) other than the capacitor, a gain at this time is expressed in Equation (2).

$$\text{gain} = Gm \times \left(\frac{R31^2 + \omega^2 L31^2}{R31}\right) = Gm \times \left(\frac{L31}{C31 R31}\right) \quad (2)$$

From Equation (2), the gain of the amplifier is reduced if the capacitance is increased, and it is raised if the inductance is increased. A method of varying the capacitance is generally used to vary the resonance frequency. The reason is that it is easy to realize a variable capacitor by an element like a varactor using a p-n junction when the capacitance is formed as an on-chip. However, from Equation (1), the gain is reduced at a lower frequency in which C is increased if the resonance frequency is varied by the capacitance while the inductance is fixed. That is, it is difficult to vary the resonance frequency largely only by varying the capacitance.

An on-chip oscillator is proposed in the Patent Document 1 that has an integrated structure of an inductor and a capacitor. This cross-sectional structure is shown in FIG. 10A, and the planar structure is shown in FIG. 10B. FIG. 10A shows the structure in cross-section AA of FIG. 10B. As shown in FIGS. 10A and 10B, a p-n junction region formed by a p-type silicon and a n-well just below inductor wiring L8 is connected to an inductor wiring. This makes a capacitance due to the p-n junction occur between the inductor wiring and ground wiring G8 connecting to the n-type substrate. Since the capacitance exists in all over the inductor wiring, this circuit becomes an oscillator which has a transmission-line type circuit as shown in FIG. 11. However, since the oscillation frequency is dependent on a delay time of the transmission-line in the circuit, the circuit does not operate as a lumped-constant LC resonator. Due to this, there has been a problem that many unwanted high-harmonic components occur.

In a LC resonance type oscillator circuit of FIG. 3 of the Patent Document 2, a secondary side inductance element (L2) is provided that is placed facing an inductance element (L1) which comprises the LC oscillation circuit and connected by mutual induction, and furthermore a capacitance element (C2) and a switch element (SW1) are connected in parallel between both terminals of the secondary inductance element. An oscillation circuit is described that expands the frequency variable range and suppresses a variation of Q so that an equivalent inductance increases as the capacitance element is connected between the both terminals of the secondary side inductance element in a state where the switch element is turned off, and that the equivalent inductance decreases as the both terminals of the secondary side inductance are short-circuited in a state where the switch element is turned on.

[Patent Document 1]
Japanese Patent Kokai Publication No. JP-P2002-319624A

[Patent Document 2]
Japanese Patent Kokai Publication No. JP-P2007-174552A, which corresponds to US Patent Application Publication No. US2007/0146088A1.

SUMMARY

The entire disclosure of Patent Documents 1 and 2 are incorporated herein by reference thereto.

The following analyses are given according to the present invention. In the method in which the variation of the inductance at the secondary side of the transformer is reflected at the first side as described in the Patent Document 2, it is merely possible to be generated the variation at the first side corresponding to only the amount of the coupling coefficient of the transformer. Particularly, if the resonance circuit is tried to be formed on the semiconductor substrate, it is difficult to get a large coupling coefficient between the first side and the secondary side due to the loss in the substrate, and the variation of the inductance value is limited.

It has been difficult to vary the oscillation frequency largely in the conventional oscillation circuit which uses an inductor and a capacitor.

According to a first aspect of the present invention, there is provided a resonance type oscillation circuit that comprises an inductance element which is connected between a first terminal and a second terminal, an amplifier circuit which is connected in parallel with the inductance element between the first terminal and the second terminal, and a first capacitance element which is connected between the first terminal and the second terminal. The oscillation circuit further comprises a pair of lead-out regions which are provided on the way of one end and the other end of the inductance element, a switch element which is connected between the pair of lead-out regions and provides short-circuit between the pair of lead-out regions when the switch element is on, and a second capacitance element which is connected in parallel with the switch element between the pair of lead-out regions.

According to a second aspect of the present invention, there is provided a semiconductor device comprising a semiconductor substrate and the oscillation circuit of the first aspect of the present invention formed on the semiconductor substrate.

The meritorious effects of the present invention are summarized as follows.

According to the invention, since an inductor and a capacitor can be switched by one switch at the same time, it is possible to vary the oscillation frequency with a wide range. A semiconductor device in which a resonance type oscillation circuit with a wide oscillation frequency range is built-in can be provided.

PREFERRED MODES

First, an outline of preferred modes of the invention will now be described, and then described in detail in accordance with each of exemplary embodiments. It should be noted that the drawings and the symbols of the drawings which are referred to in the description of the outline are for showing one example of the preferred modes, and the variations of the preferred modes of the present invention are not limited by them.

As one example is shown in FIG. 1, FIG. 2, FIGS. 4-8, an oscillation circuit in one preferred mode of the present invention is a resonance type oscillation circuit including an inductance element (1, 1A+1B) which is connected between a first terminal and a second terminal (OUTT, OUTB), an amplifier circuit 2 which is connected in parallel with the inductance element (1, 1A+1B) between the first terminal and the second terminal (OUTT, OUTB), and a first capacitance element (V1, C1) which is connected between the first terminal and the second terminal. A pair of lead-out regions (B and C; A and T; H and K; I and J; E and F) are provided on the way of one end and the other end (OUTT, OUTB) of the inductance element (1, 1A+1B). A switch element(s) (M1, M2, M21) is connected between the pair of lead-out regions and provides short-circuit between the pair of lead-out regions when the switch element(s) is on, and a second capacitance element(s) (V2, C2, V21, V22) is connected in parallel with the switch element(s) between the pair of lead-out regions (B and C; A and T; H and K; I and J; E and F).

Figure 7:
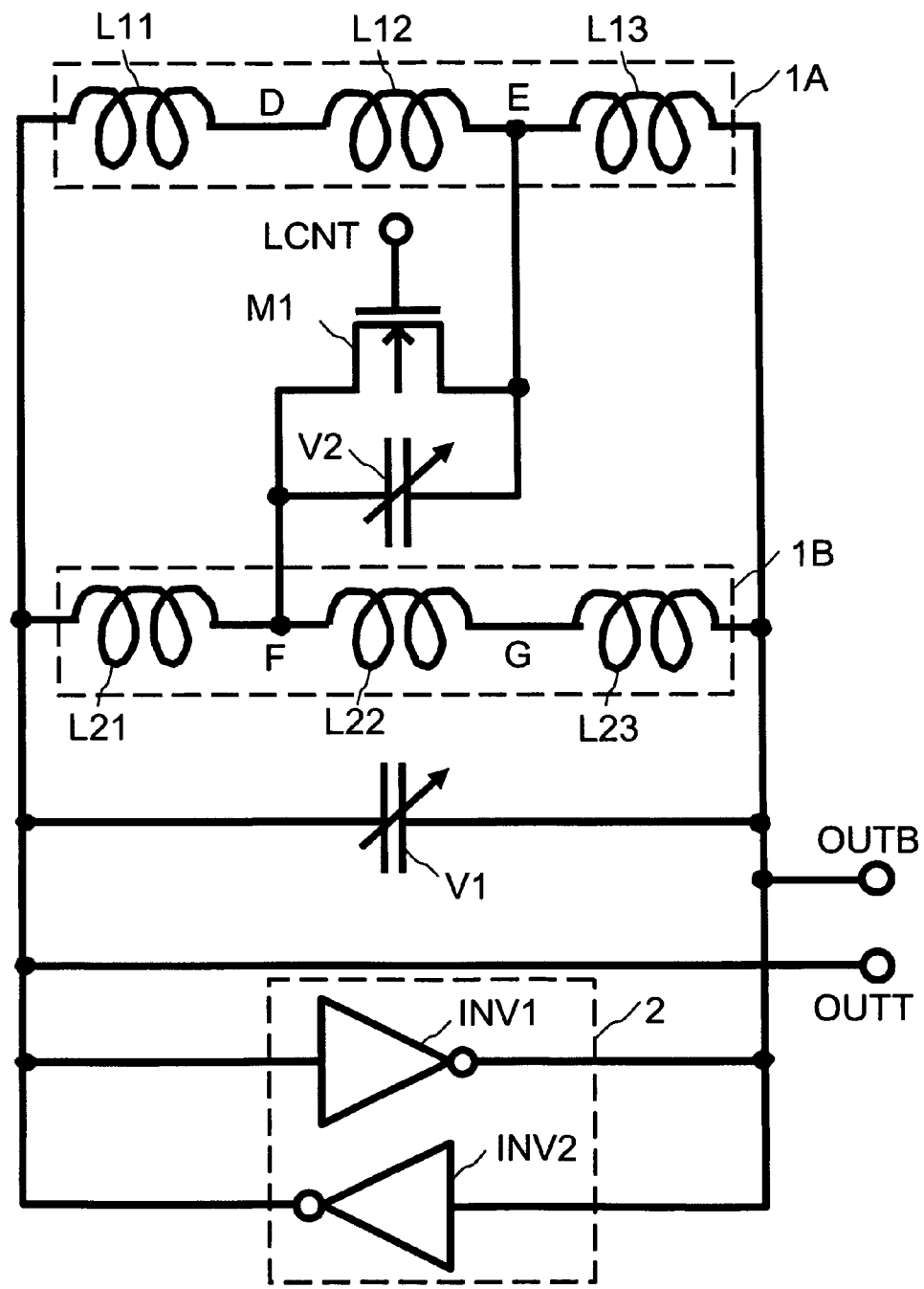
FIG. 7 is a block diagram of an oscillation circuit according to a fifth exemplary embodiment.
Figure 8:
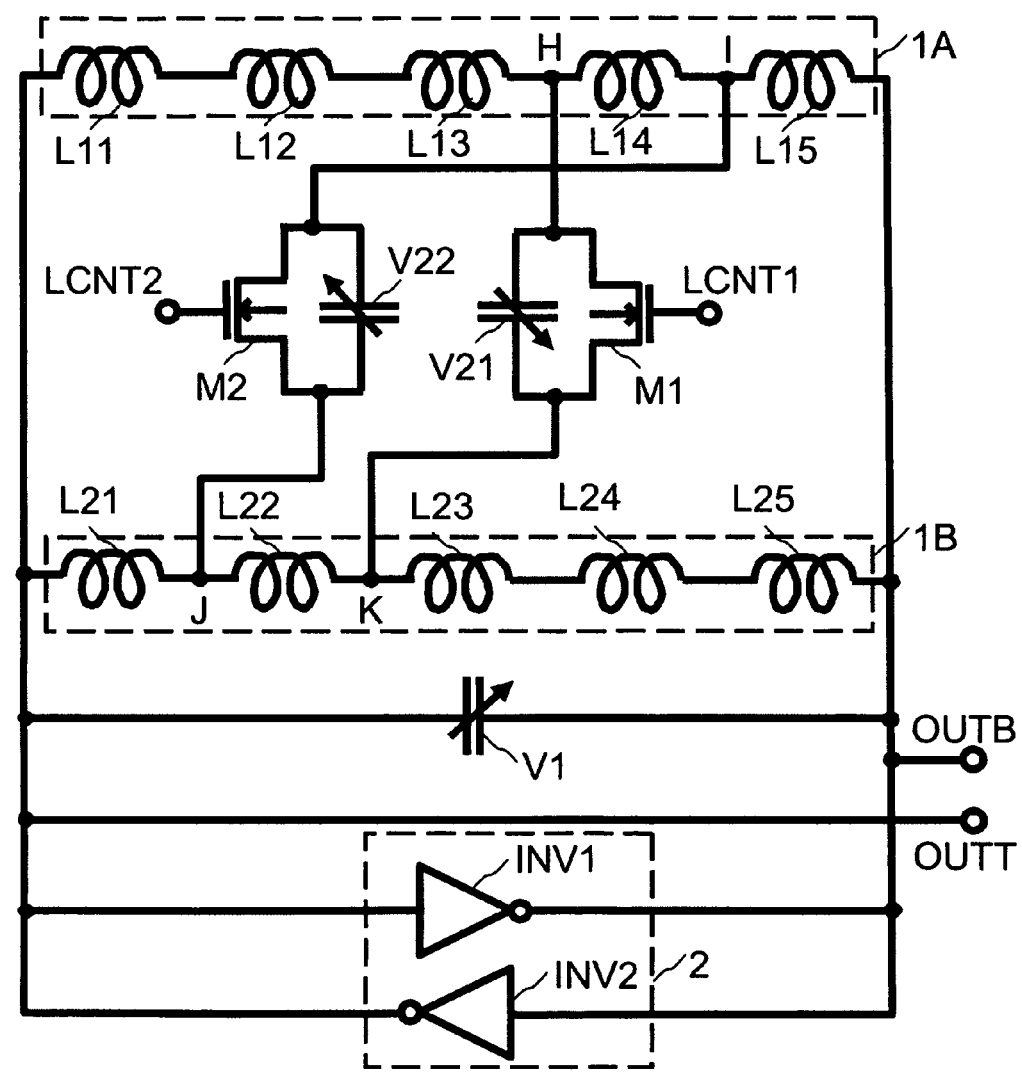
FIG. 8 is a block diagram of an oscillation circuit according to a sixth exemplary embodiment.
Figure 9:
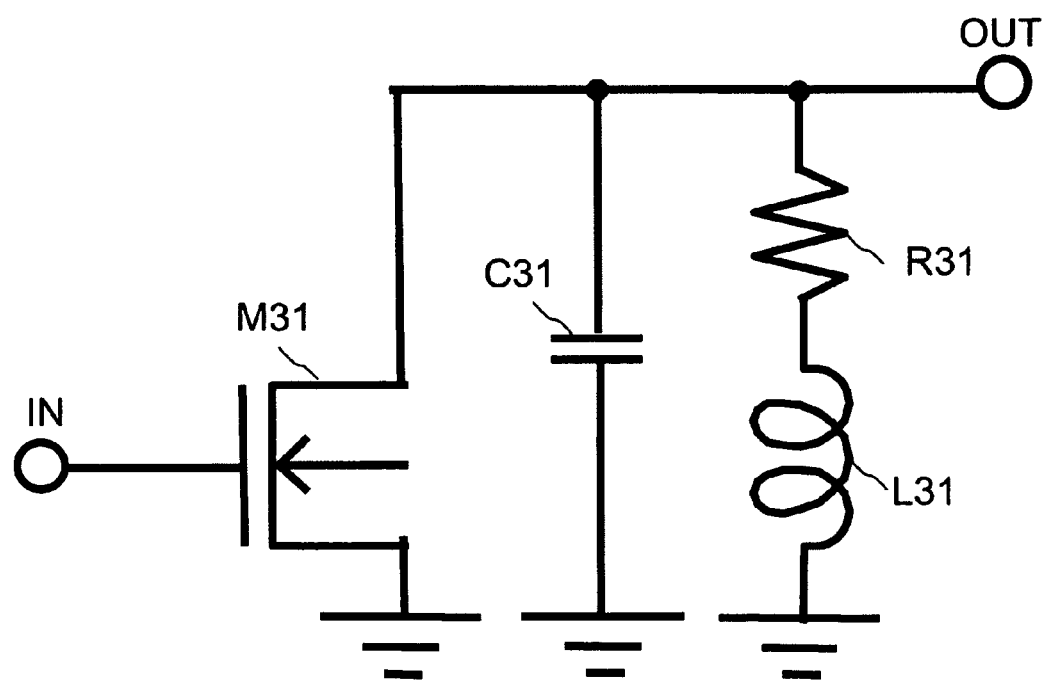
FIG. 9 is an equivalent circuit diagram illustrating an amplifier which uses a resonance circuit.
Figure 10A:
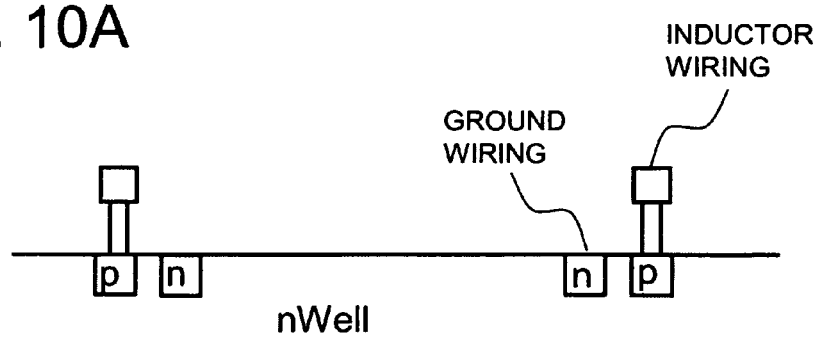
FIGS. 10A and 10B show a structure of a conventional distributed constant type resonance circuit, where 10A is a figure showing the structure in the cross-section AA, and 10B is a figure showing the planar structure.
Figure 10B:
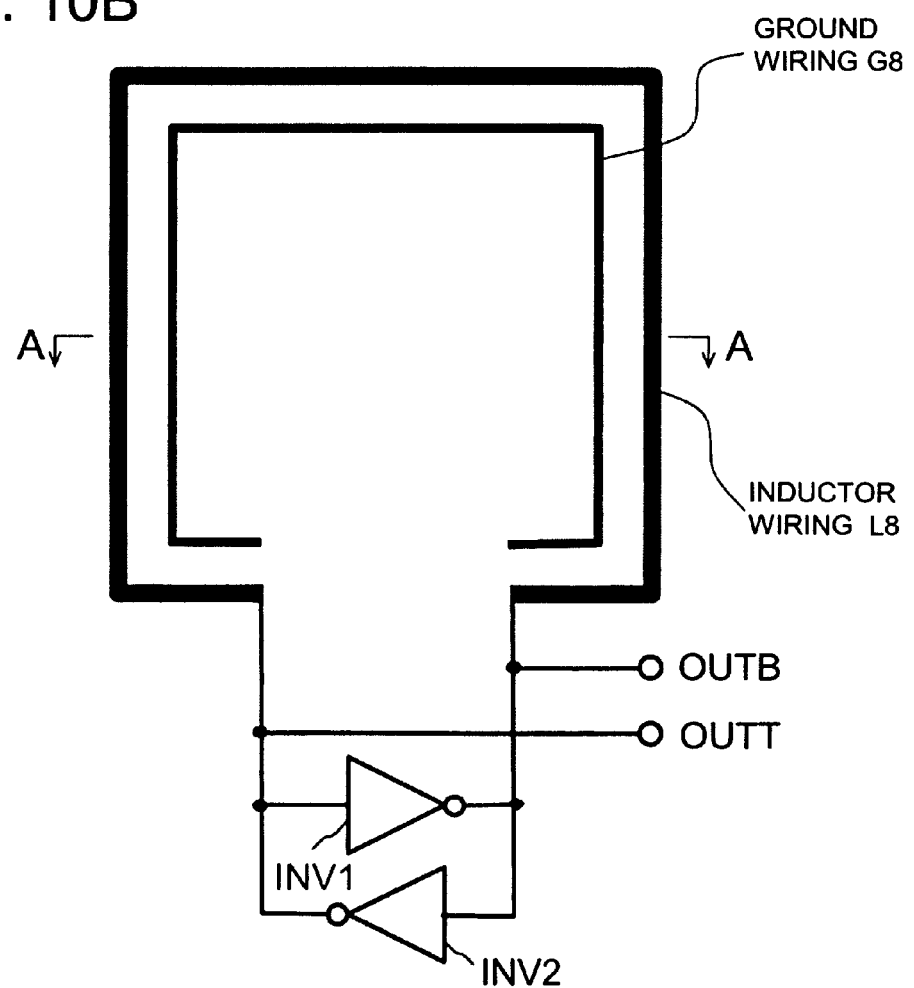
Figure 11:
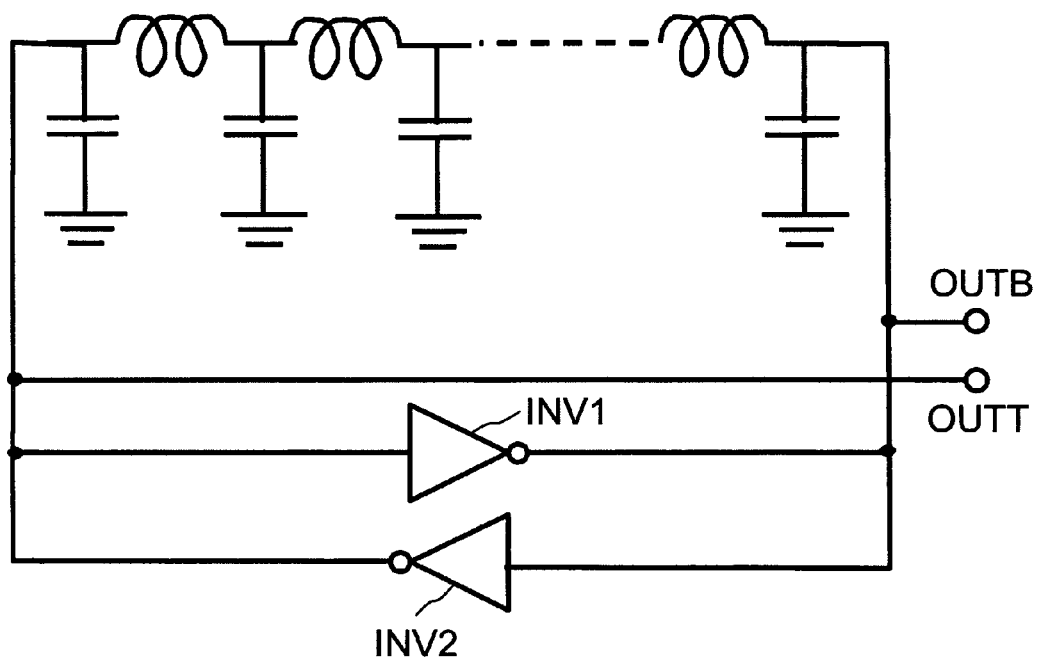
FIG. 11 is an equivalent circuit diagram of a conventional distributed constant type resonance circuit.

As one example is shown in FIG. 7, FIG. 8, the inductance element in an oscillation circuit of one preferred mode of the present invention may include a first portion and a second portion (1A and 1B) connected in parallel between the first terminal and the second terminal (OUTT, OUTB).

As one example is shown in FIG. 1, FIG. 2, FIGS. 5-8, the inductance element (1, 1A+1B) and the pair of lead-out regions (B and C; H and K; I and J; E and F) are placed symmetrically so that an electrical characteristics at the first terminal (OUTT) and those at the second terminal (OUTB) are equivalent each other whether the switch element (M1, M2, M21) is on or off.

Figure 5:
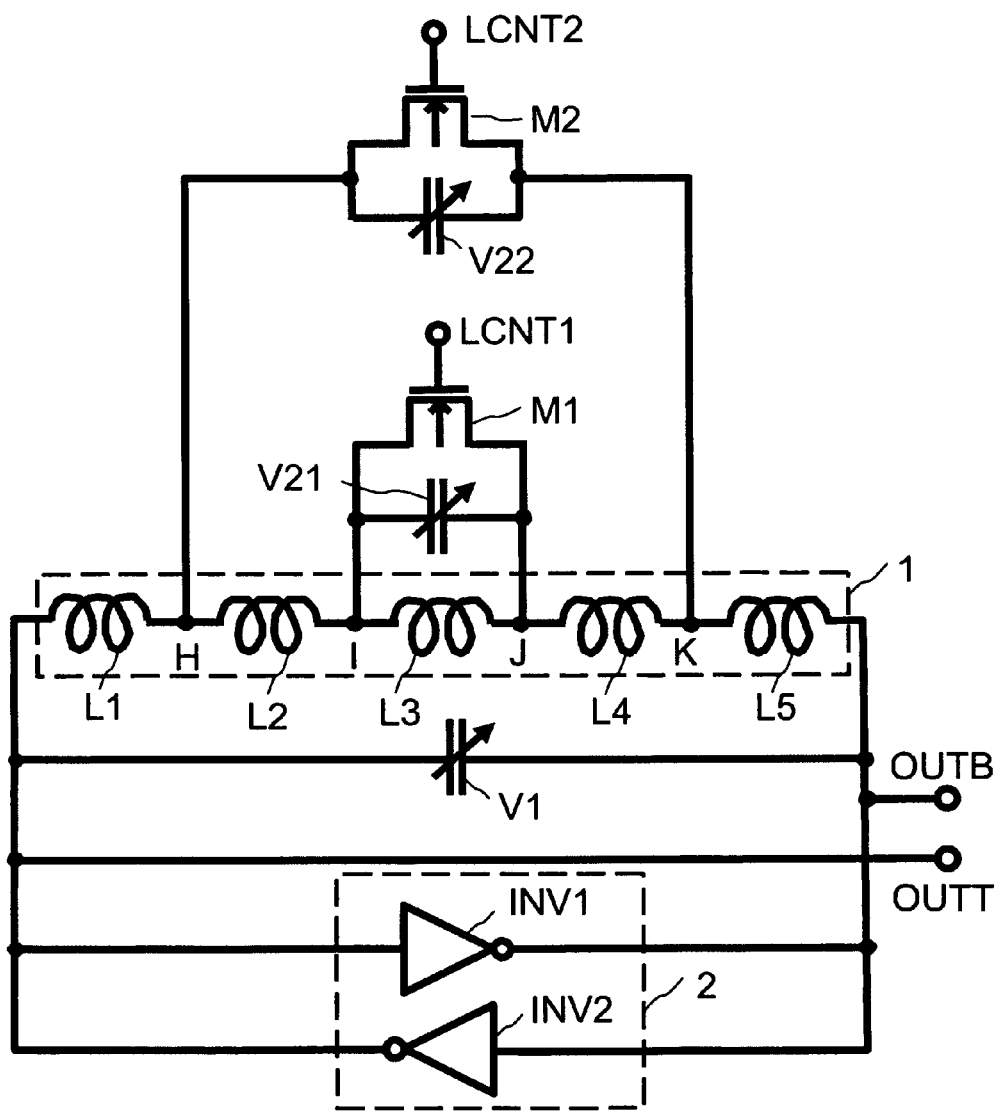
FIG. 5 is a block diagram of an oscillation circuit according to a third exemplary embodiment.

As one example is shown in FIG. 5, FIG. 8, a plurality pairs of the lead-out regions (H and K; I and J) are provided. Each of the lead-out regions is provided on the way of one end and the other end (OUTT, OUTB) of the inductance element (1, 1A+1B). A plurality of the switch elements (M1, M2) are provided. Each of the switch elements (M1, M2) is connected between corresponding one pair of the plurality pairs of lead-out regions. A plurality of the second capacitance elements (V21, V22) are provided. Each of the second capacitance elements is connected between corresponding one pair of the plurality pairs of lead-out regions in parallel with corresponding one of the switch elements. the inductance element and each of the plurality pairs of lead-out regions are placed symmetrically so that an electrical characteristics at the first terminal (OUTT) and those at the second terminal (OUTB) are equivalent each other whether any of switch elements are turned on or off. By placing symmetrically the inductance element and the lead-out regions in this way, each of the switch element(s) is connected to the center point of the inductor when each of switch elements is on. Since the voltage potential of this point is not varied while oscillating, the influence of a parasitic capacitance(s) of the switch element(s) to the oscillation frequency can be removed.

Figure 4:
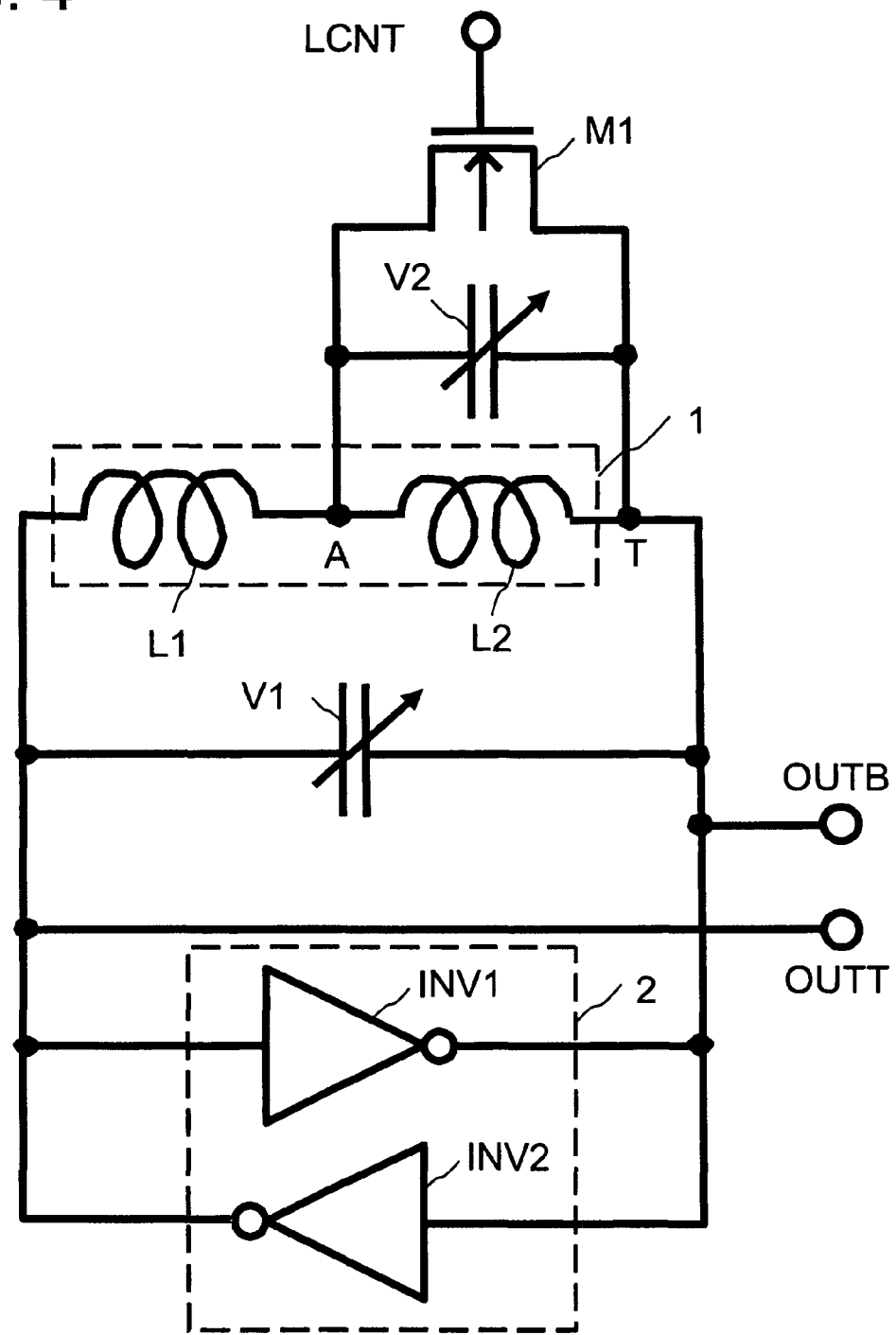
FIG. 4 is a block diagram of an oscillation circuit according to a second exemplary embodiment.

As one example is shown in FIG. 4, one of the plurality of the lead-out regions T may be provided at the end of inductance element 1. However, it is undesirable that the switch element is connected to both ends of the inductance because the oscillation can not be maintained when the switch element is on. Therefore, in this case, the lead-out regions can not be placed symmetrically.

As one example is shown in FIG. 7, a first lead-out region E may be provided on the way of one end and the other end (OUTT, OUTB) of the first portion 1A of the inductance element (1A+1B). The second lead-out region F may be provided on the way of one end and the other end (OUTT, OUTB) of the second portion 1B of the inductance element (1A+1B). The switch element M1 and the second capacitance element V2 may be connected in parallel between the first lead-out region E and the second lead-out region F.

Furthermore, as one example is shown in FIG. 8, the inductance element (1A+1B) may include a first portion 1A of the first inductance element and a second portion 1B of the inductance element in which a plurality of lead-out regions (H, I; J, K) are provided respectively, and a plurality of switch elements (M1, M2) and a plurality of the second capacitance elements (V21, V22) may be connected respectively in parallel between a plurality of lead-out regions (H, I) which are provided in the first portion 1A of the inductance element and a plurality of lead-out regions (J, K) which are provided in the second portion 1B of inductance element.

As one example is shown in FIG. 1, FIGS. 4-8, at least one capacitance of the first and the second capacitance elements may be variable. It is possible to expand the frequency variable range and perform a fine adjustment of the oscillation frequency by making the capacitance value variable in addition to varying the inductance value and the capacitance value by turning on/off of the switch element(s). Although it is preferable that both the first and the second capacitance elements are made to be variable, the effect can be obtained by making at least one of them variable. However, the effect of making the capacitance value of the second capacitance element variable can be obtained only if the switch element which is connected in parallel to the second capacitance element is off.

Figure 6:
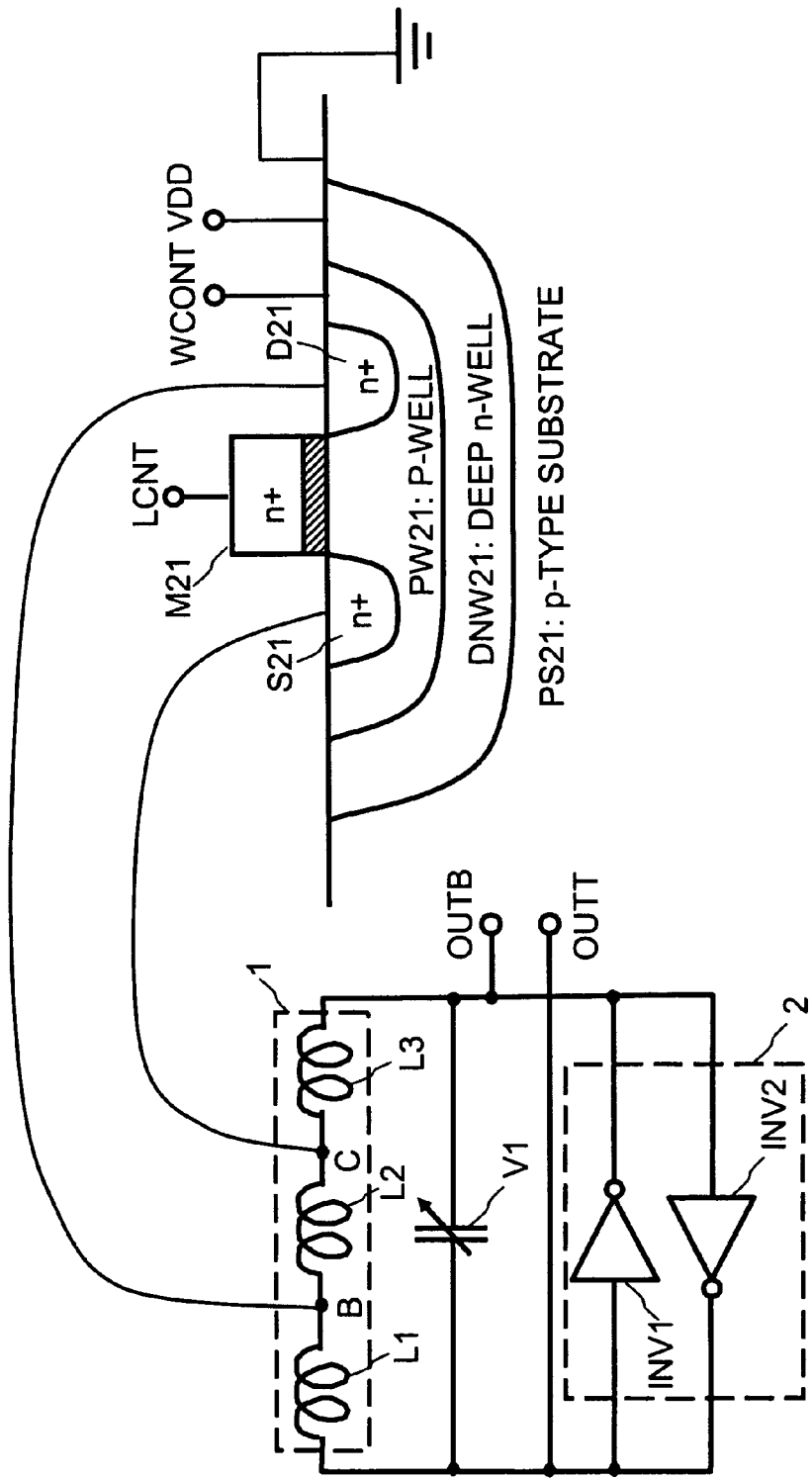
FIG. 6 is a schematic view showing a cross-sectional structure of a switch element and a second capacitance element in a fourth exemplary embodiment.

As one example is shown in FIG. 6, in the semiconductor device of the present invention, the above-mentioned oscillation circuit can be formed on semiconductor substrate PS21. That is, all of the inductance element(s), the amplifier circuit(s), the capacitance element(s) and the switch element(s) of the above-mentioned oscillation circuit can be formed on the semiconductor substrate. Therefore, a semiconductor integrated circuit in which the above-mentioned oscillation circuit is built-in with other circuits can also be realized.

As one example is shown in FIG. 6, the capacitance element may be a p-n junction capacitance which is formed in semiconductor substrate PS21. In FIG. 6, a capacitance element, in which a p-n junction capacitance between source/drain region D21 and p-well PW21, a p-n junction capacitance between p-well PW21 and source/drain region S21 are connected in series, is provided between lead-out region B and lead-out region C.

As one example is shown in FIG. 6, the switch element may be a MISFET. In FIG. 6, MISFET (M21) is used as a switch element.

As one example is shown in FIG. 6, the capacitance element may be a p-n junction which is formed in source/drain region (D21, S21). In FIG. 6, a p-n junction capacitance between source/drain regions (D21, S21) and p-well PW21 is used as a capacitance element.

As one example is shown in FIG. 6, MISFET (M21) is formed on a surface of well PW21 which is provided on a surface of semiconductor substrate PS21, and it is possible to make the capacitance value of the above-mentioned capacitance element variable by controlling a voltage potential of well PW21. In FIG. 6, it is considered that a voltage potential of well PW21 has a fixed DC potential by means of a voltage potential supplied to terminal WCONT, but it does not have a fixed AC potential. Hence, it is possible to make the capacitance value of the second capacitance element, which is the capacitance connected in series of a p-n junction capacitance between source/drain region D21 and p-well PW21 and a p-n junction capacitance between p-well PW21 and source/drain region S21, variable.

The explanation of the outline is now ended, and the embodiments of the present invention will now be described in more detail with reference to the drawings.

First Exemplary Embodiment

Figure 1:
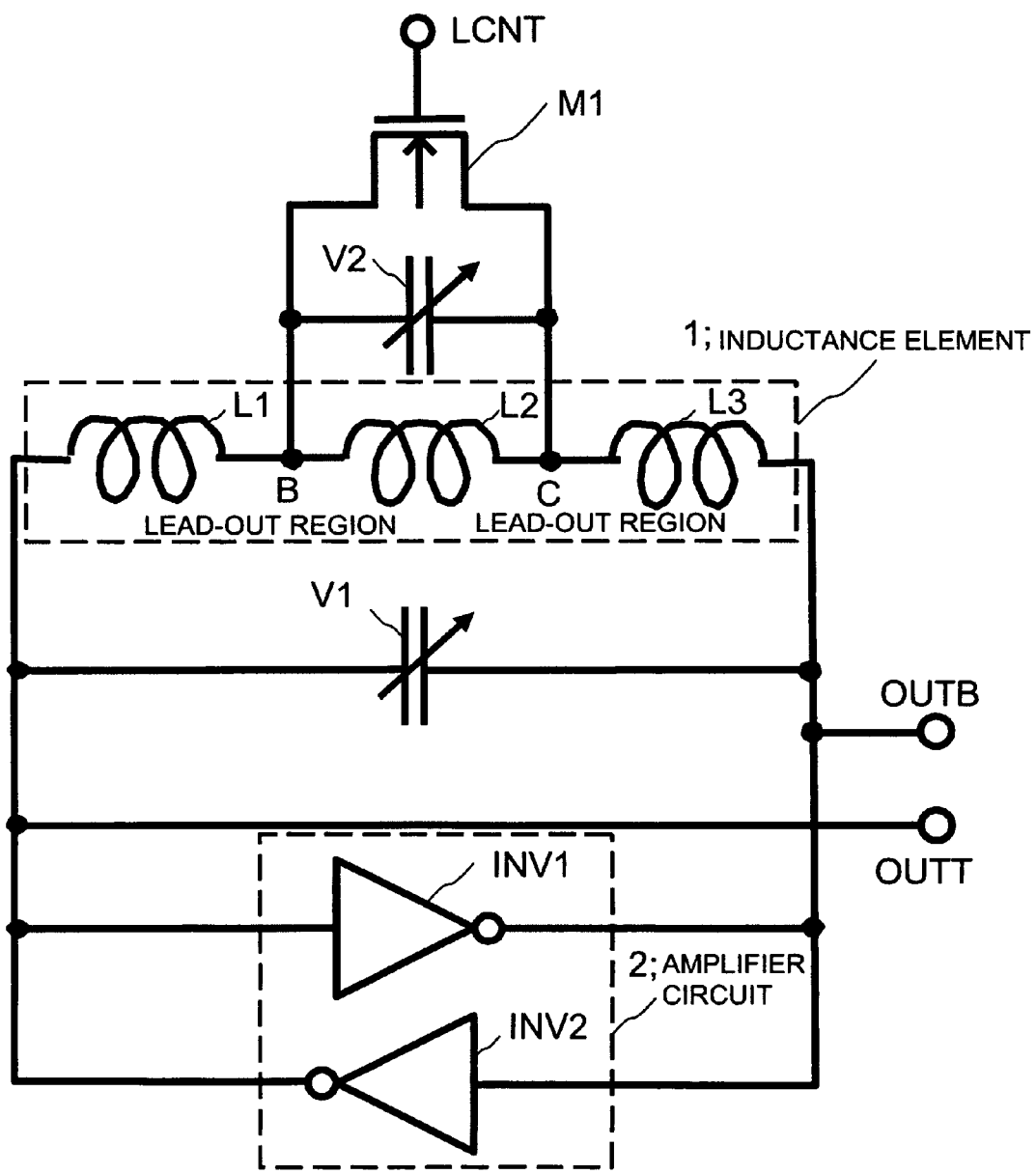
FIG. 1 is a block diagram of an oscillator circuit according to a first exemplary embodiment of the present invention.

FIG. 1 is a block diagram of an oscillation circuit according to a first exemplary embodiment. In FIG. 1, OUTT terminal and OUTB terminal are input/output terminals of the oscillation circuit. An oscillation waveform is generated between OUTT terminal and OUTB terminal. Inductance element 1 and amplifier circuit 2 are connected in parallel between OUTT terminal and OUTB terminal. Amplifier circuit 2 of FIG. 1 includes inverter circuit INV1 in which the input is connected to OUTT terminal and the output is connected to OUTB terminal, and inverter circuit INV2 in which the input is connected to OUTB terminal and the output is connected to OUTT terminal. Amplifier circuit 2 is not limited to the constitution of FIG. 1, and may be an amplifier having any constitutions as long as it amplifies and maintains a resonance between OUTB terminal and OUTT terminal caused by an inductance and a capacitance. However, it is preferable that the constitution is symmetrical when it is seen from OUTB terminal and OUTT terminal. Furthermore, capacitance element V1 is connected between OUTT terminal and OUTB terminal. The capacitance element V1 is a varactor in which the capacitance value can be made variable.

Lead-out regions B, C are provided on the way of one end and the other end (OUTT, OUTB) of inductance element 1, and capacitance element V2 and switch M1 are connected in parallel between lead-out region B and lead-out region C. Capacitance element V2 is also a varactor like capacitance element V1, and its capacitance value can be made variable. Although both capacitance elements V1 and V2 are variable capacitances using varactors in FIG. 1, they may be fixed capacitances. However, it is preferable that at least one of them is variable in order that the oscillation frequency of the oscillation circuit can be varied at will, and that both of them are variable in order that the oscillation frequency range can be varied with wider range at will. The varactor is only an example as a variable capacitance, and any variable capacitance other than a varactor may be available as long as its capacitance value can be controlled by an external circuit not shown in the figure. Switch M1 is a MISFET (Metal Insulator Semiconductor Field Effect Transistor), and is on/off controlled by control signal LCNT which is supplied by an external unit in FIG. 1.

Inductance element 1 includes a series connection of inductor L1, inductor L2 and inductor L3 in which lead-out regions B, C are inserted between them. It is preferable that inductor L1 and inductor L3 are placed symmetrically so that the electrical characteristics of inductance element 1 at OUTT terminal and those at OUTB terminal are equivalent each other in which OUTT terminal and OUTB terminal are connected to both ends of inductance element 1. In other words, it is preferable that lead-out region B and lead-out region C are placed symmetrically so that the electrical characteristics of the inductance element at OUTT terminal and those at OUTB terminal are equivalent each other.

Inductors L1 to L3 and varactors V1, V2 constitute a LC type resonance circuit. When switch M1 is off, the inductance of the LC type resonator between OUTT terminal and OUTB terminal is a sum of L1, L2 and L3, and the capacitance of that can be considered to be a parallel connection of V1 and V2. When switch M1 is on, the inductance of the LC type resonator is a sum of L1 and L3, and the capacitance can be considered to be only V1. If inductor L1 and inductor L3 are placed symmetrically and the LC type resonator is configured symmetrically, lead-out regions B and C which are connected to MISFET M1 become the center point of the inductor when the switch element is on. Due to this, the voltage potential of this point is not varied while oscillating, and a parasitic capacitance (illustration omitted) which the MISFET connecting to this point has does not influence the oscillation frequency.

Next, the electrical characteristics of this oscillation circuit will be analyzed in detail. In FIG. 1, by neglecting a series resistance of the inductance and the capacitance, an admittance Y of the oscillator at OUTT-OUTB terminals, which is constituted by the inductor and the capacitors, will be calculated when the switch is off. Assuming the capacitance values of V1 and V2 are constant value C1 and C2 respectively, the calculation is performed. An admittance Y is given by Equation (3) from FIG. 1.

$$Y = j\omega C1 + \cfrac{1}{j\omega(L1+L3) + \cfrac{1}{\cfrac{1}{j\omega L2} + j\omega C2}} \quad (3)$$

$$= \frac{(1-\omega^2 C1(L1+L3)) \times (1-\omega^2 C2L2) - \omega^2 C1L2}{j\omega((L1+L3) \times (1-\omega^2 C2L2) + L2)}$$

$$= \frac{\omega^4 C2L2C1(L1+L3) - \omega^2(C1(L1+L3) + C1L2 + C2L2) + 1}{j\omega((L1+L3) \times (1-\omega^2 C2L2) + L2)}$$

The oscillation frequency of this oscillator is a frequency in which the numerator of the admittance Y is equal to 0 in Equation (3). Equation (3) has two resonance frequencies. Since the $\omega^4$ term can be neglected if $C2 \times L2$ is small enough, and the higher oscillation frequency can be neglected, and the oscillation frequency when the switch is off is expressed in Equation (4).

$$f_{OFF} = \frac{1}{2\pi\sqrt{C1(L1+L2+L3)+C2L2}} \quad (4)$$

That is, the oscillation frequency of the oscillator can be lowered by an amount $C2 \times L2$ than that in which the oscillator does not have C2. That is, C2 acts substantially as a capacitance in Equation (5).

$$C2 \times \frac{L2}{L1+L2+L3} \quad (5)$$

Since both C1 and C2 are variable capacitances, the variation of C2 can also contribute to the variation of the oscillation frequency. Since when the switch is on, both ends of L2 and C2 are short-circuited, the capacitance of the entire resonator is C1, and the inductance of the entire resonator is L1+L3, and the oscillation frequency is expressed in Equation (6).

$$f_{ON} = \frac{1}{2\pi\sqrt{C1(L1+L3)}} \quad (6)$$

That is, the inductance value and the capacitance value can be increased or decreased by one switch at the same time. Since the capacitance value can be small when the inductance value is small, it is possible to suppress the gain drop when the inductance is reduced. Although the above-mentioned calculation is performed by fixed capacitances, as V1 and V2 are variable capacitances, $f_{OFF}$ and $f_{ON}$ can be increased or decreased respectively by the variations of values of C1 and C2. If the inductor is symmetrical, lead-out regions B and C of the switch element becomes the center point of the inductor when the switch element is on. Therefore, in FIG. 1, if the oscillation circuit which is constituted by INV1 and INV2 is symmetrical, the voltage of the center point of the inductor is not varied while oscillating. Due to this, even though MISFET which is a switch element has a parasitic capacitance, this capacitance does not influence the oscillation frequency when the switch element is on.

Next, the case in which $C2 \times L2$ is large in Equation (3) will be considered. The term $\omega^4$ can not be neglected this time. Assuming $\omega^2 C2L2 \gg 1$ in Equation (3), Equation (7) will be true.

$$Y = \frac{-\omega^2 L2(C1+C2-\omega^2 C1C2(L1+L3))}{j\omega((L1+L3) \times (1-\omega^2 C2L2) + L2)} \quad (7)$$

By using Equation (7), the higher oscillation frequency can be calculated by Equation (8).

$$fh = \frac{1}{2\pi}\sqrt{\frac{C2+C1}{C1C2(L1+L3)}} \quad (8)$$

If the higher oscillation frequency fh is double of the lower oscillation frequency $f_{OFF}$, high-harmonic components of $f_{OFF}$ and components of fh enhance each other, and hence oscillation of fh becomes dominant than that of $f_{OFF}$, the oscillation of $f_{OFF}$ can not be obtained. The condition that this happens can be obtained by Equation (9).

$$fh/f_{OFF} = \quad (9)$$

$$\frac{1}{2\pi}\sqrt{\frac{C2+C1}{C1C2(L1+L3)}} \Big/ \frac{1}{2\pi\sqrt{C1(L1+L2+L3)+C2L2}} = 2$$

Since high-harmonic components than more than or equal to three is small, it can not be a dominant oscillation even though these frequencies overlap with fh. Therefore, it is preferable to select C2 and L2 as in Equation (10) in order to get a steady oscillation.

$$\frac{(C2+C1) \times (C1(L1+L2+L3)+C2L2)}{C1C2(L1+L3)} > 4 \quad (10)$$

For example, if L2<<L1+L3, C2L2<<C1(L1+L3) then C1>3C2, and hence this condition can be satisfied.

Figure 2:
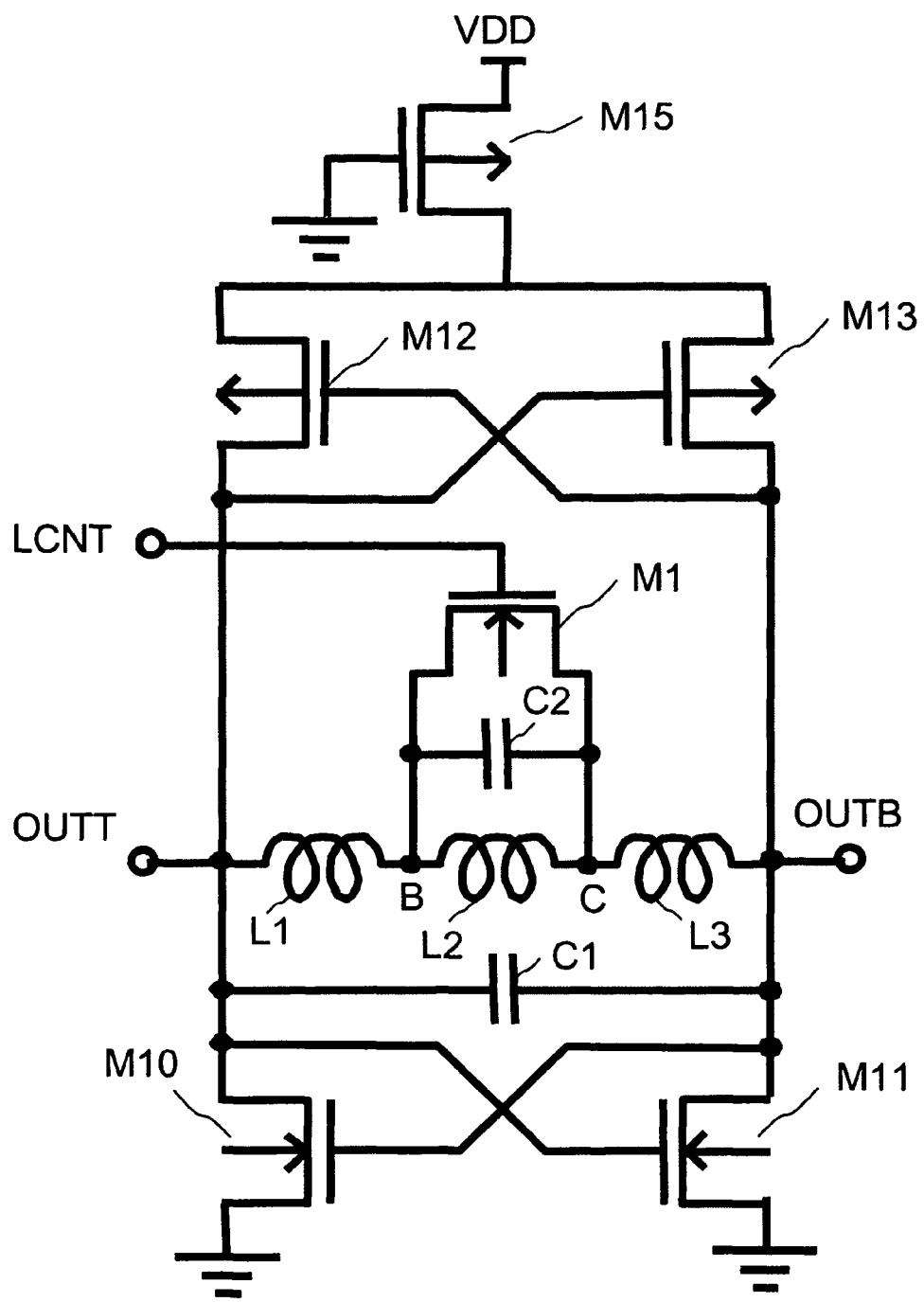
FIG. 2 is one example of a circuit diagram showing a detailed constitution of an oscillation circuit according to a first exemplary embodiment.
Figure 3:
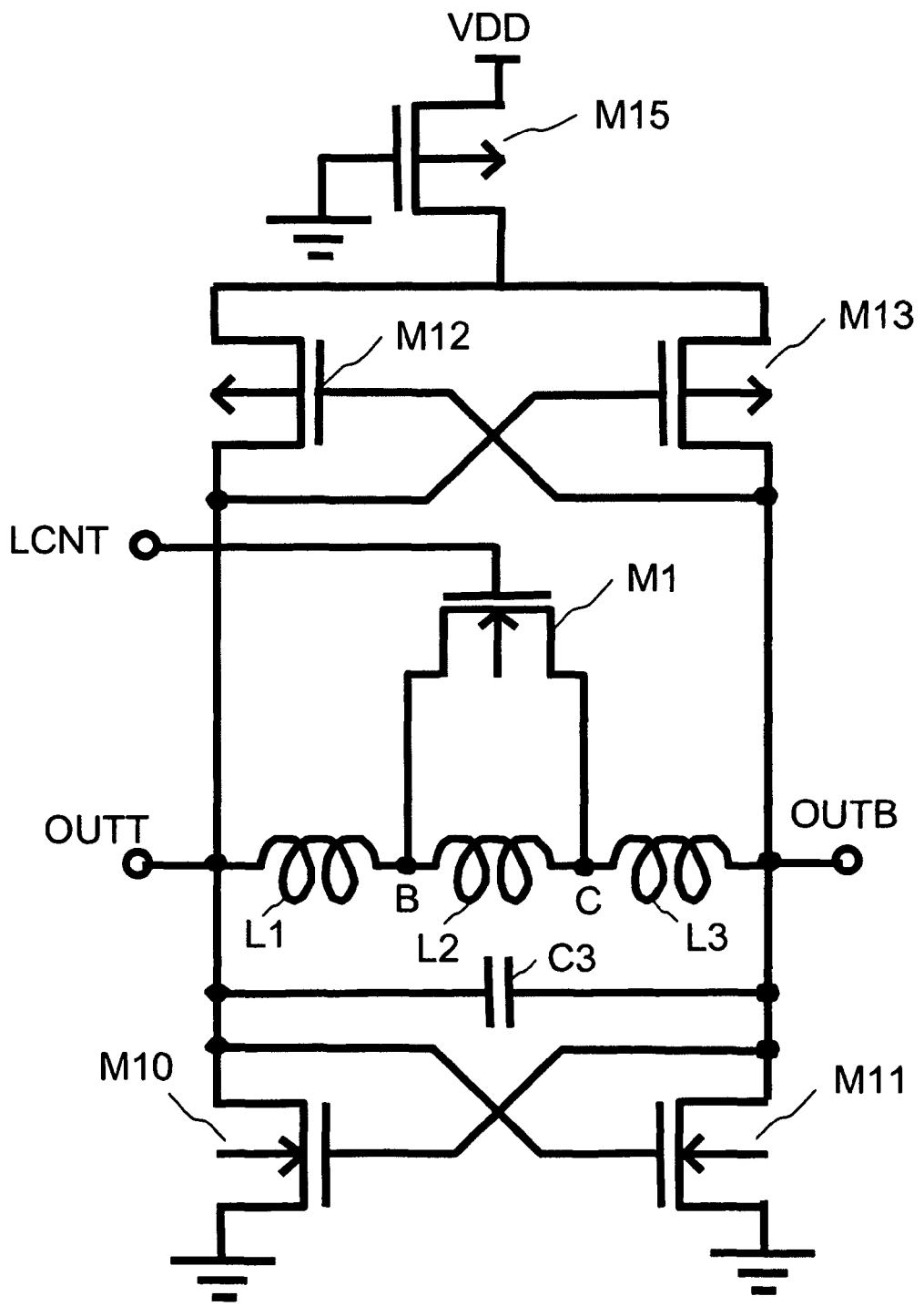
FIG. 3 is a circuit diagram of an oscillation circuit of a comparative example.

FIG. 2 is one example of a circuit diagram showing a more detailed constitution of an oscillation circuit according to the first exemplary embodiment. The same symbols as in FIG. 1 are noted for elements, circuits, terminals and signals in FIG. 2 if they have the same constitution and functions as in FIG. 1, and duplicative descriptions will be omitted. In FIG. 2, MISFET M13 and M11, M12 and M10 constitute inverter circuits respectively, and they constitute amplifier circuit 2 together with MOSFET M15 which is a current source of the inverter circuits. In FIG. 2, both the first capacitance element C1 and the second capacitance element C2 are used as fixed capacitors. The other constitutions are the same as described in FIG. 1. FIG. 3 is a comparative circuit of FIG. 2. In the circuit of FIG. 3, the second capacitance element C2 is removed from FIG. 2, and the first capacitance C1 is replaced by a fixed capacitance C3 having a larger capacitance value. The other constitutions are identical to FIG. 2.

The variations of the oscillation frequency in the circuit of the first exemplary embodiment in FIG. 2 and that of the comparative example in FIG. 3 when the switch element is on/off are calculated by SPICE simulation. The results are shown in Table 1. In the simulation shown in Table 1, the simulation is performed by assuming that CMOS with 90 nm nodes is used. The simulation condition is that source voltage VDD=1 V, and control voltage of the switch element LCNT is 0 V (off) or 1 V (on). L1=L3=2.5 nH, L2=5 nH, and it is assumed that L1, L3 have series parasitic resistances 10Ω, and L2 has a series parasitic resistance 20Ω. Furthermore, C1=C2=0.1 pF, C3=0.15 pF.

TABLE 1

| switch element M1 | embodiment (FIG. 2) | comparative example(FIG. 3) |
| --- | --- | --- |
| OFF | 3.49 GHz | 3.43 GHz |
| ON | 5.77 GHz | 4.90 GHz |

As shown in Table 1, by comparing the exemplary embodiment in FIG. 2 with comparative example in FIG. 3, it is recognized that a wider variation of the oscillation frequency is achieved in the exemplary embodiment in FIG. 2. That is, it is recognized that it is possible to expand the variable range of the oscillation frequency more widely by not only providing switch element M1 but connecting the second capacitance element C2 to switch element M1 in parallel.

Second Exemplary Embodiment

FIG. 4 is a block diagram of an oscillation circuit according to the second exemplary embodiment. The same symbols as in FIG. 1 are noted for elements, circuits, terminals and signals in FIG. 4 if they have the same constitution and functions as in FIG. 1, and duplicative descriptions will be omitted. In FIG. 4, lead-out regions A and T are provided in inductance element 1. Lead-out region A is provided between a plurality of inductors which constitute inductance element 1 and are connected in series. However, lead-out region T is provided at the end of inductance element 1. MISFET M1 which has a function as a switch element and varactor V2 which is the second capacitance element are connected in parallel between lead-out regions A and T. In FIG. 4, since lead-out region T is provided at the end of inductance element 1, the positions of lead-out regions A and T are not symmetrical when they are seen from OUTT terminal and OUTB terminal. However, if an influence of a parasitic capacitance of MISFET M1 which is a switch element to the oscillation frequency is not treated as a problem, the constitution of FIG. 4 does not have a problem. In the second exemplary embodiment of FIG. 4, since it is also possible to vary the inductance value and capacitance value of the LC type resonance oscillator at the same time by turning on/off of one switch element M1, it is possible to get a wide oscillation frequency range.

Third Exemplary Embodiment

FIG. 5 is a block diagram of an oscillation circuit according to a third exemplary embodiment. In FIG. 5, lead-out regions H, I, J and K are provided at four locations on the way of the wiring of inductance element 1, and inductance element 1 is considered to be an inductance element in which five inductors L1, L2, L3, L4 and L5 are connected in series. It is preferable that inductors L1 and L5, L2 and L4 are placed to be symmetrical respectively so that the electrical characteristics at terminal OUTT and those at terminal OUTB are equivalent each other in which the terminals OUTT, OUTB are connected to the ends of inductance element 1. In other words, lead-out regions I and J, lead-out regions H and K are placed to be symmetrical respectively when they are seen from terminals OUTT and OUTB. Switch M1 and capacitance element V21 between lead-out regions I and J, switch M2 and capacitance element V22 between lead-out regions H and K are connected in parallel respectively. Switch elements M1, M2 include MISFETs, and capacitance elements V1, V21 and V22 include varactors which are variable capacitance elements. Capacitance elements V1, V21 and V22 may be fixed capacitance. However, it is preferable that a portion of capacitance elements V1, V21 and V22, or all the capacitance elements more preferably, are constituted as a variable capacitance element in order to get a wide variable frequency range and vary the frequency at will.

When switch elements M1, M2 are off, the inductance of the LC type resonator is a sum of L1 to L5, and the capacitance can be considered as a parallel connection of V1, V21 and V22. When switch element M1 is on, the inductance of the LC type resonator is a sum of L1, L2, L4 and L5, and the capacitance can be considered as a parallel connection of V1 and V22. When switch element M2 is on, the inductance of the LC type resonator is a sum of L1 and L5, and the capacitance is only V1. If inductance element 1 and lead-out regions H to K are placed so that the LC type resonator is symmetrical, lead-out regions I, J connecting to MISFET M1 become the center point of the inductor when switch element M1 is on. Due to this, as the voltage potential of this point does not vary while oscillating, a parasitic capacitance of MISFET connecting to this point (not shown in the figure) does not influence the oscillation frequency. Furthermore, when switch element M2 is on, lead-out regions H, K connecting to MISFET M2 become the center point of the inductor. Due to this, as the voltage potential of this point does not vary while oscillating, parasitic capacitances of MISFET M2 and M1 located at the inside of M2, which connect to this point (not illustrated in the figure), do not influence the oscillation frequency.

Fourth Exemplary Embodiment

FIG. 6 is a schematic view showing a cross-sectional structure of a switch element and a second capacitance element which constitute an oscillation circuit in a semiconductor device of a fourth exemplary embodiment. The fourth exemplary embodiment is an exemplary embodiment of a semiconductor device in which the oscillation circuit of the first exemplary embodiment shown in FIG. 1 is formed on a semiconductor substrate. A constitution of the oscillation circuit of the fourth exemplary embodiment is basically identical to the constitution of the oscillation circuit of the first embodiment. However, it shows one specific example in which switch element M21 (corresponding to switch element M1 in FIG. 1) and variable capacitance element V2 are formed on a semiconductor substrate. Switch element M21 is formed as a n-type MISFET on the semiconductor substrate.

In FIG. 6, n-type MISFET M21 is formed on a surface of p-well PW21 which is further provided on a surface of deep n-well DNW21 which is provided on a surface of a p-type substrate PS21. Lead-out regions B, C which are provided at both ends of inductor L2 are connected to source/drain regions D21, S21 which are a drain and a source of n-type MISFET M21 respectively. Control signal LCNT is connected to a gate electrode of n-type MISFET M21. P-type substrate PS21 is connected to the ground potential, and deep n-well DNW21 is connected to voltage source potential VDD. The voltage potential of DNW21 is not limited to voltage source potential VDD, and it may be any value higher than the voltage of p-well PW21. If a voltage of control signal LCNT connecting to a gate of n-type MISFET M21 is less than or equal to a threshold voltage of n-type MISFET M21, M21 is off and the inductance of the LC type resonator is a sum of L1, L2 and L3. On the other hand, if the voltage of LCNT is more than or equal to the threshold voltage of M21, M21 is on, and the inductance of the LC type resonator is a sum of L1 and L3. Source/drain regions S21, D21 forms p-n junctions between them and p-well PW21, and the p-n junctions have capacitances. These capacitances are capacitance between S21 and PW21, and that between D21 and PW21. If the source and drain of MISFET are let to be symmetrical, and a voltage of PW21 is let to be constant, it can be considered that one capacitance in which both of the capacitances are connected in series exists between S21 and D21. Since this capacitance is formed by the p-n junctions, the capacitance value can be varied by varying the voltage potential of PW21 at WCONT terminal. That is, it can be substantially made to work similarly to variable capacitance V2 in FIG. 1.

Fifth Exemplary Embodiment

FIG. 7 is a block diagram of an oscillator circuit according to a fifth exemplary embodiment. In the oscillation circuit of the fifth exemplary embodiment in FIG. 7, first portion 1A and second portion 1B of inductance element (1A+1B) are connected in parallel between OUTT terminal and OUTB terminal. Lead-out region E is provided on the way of one end and the other end (OUTT, OUTB) of the first portion 1A of the inductance element (1A+1B), and lead-out region F is provided on the way of one end and the other end (OUTT, OUTB) of the second portion 1B of the inductance element (1A+1B). Furthermore, switch element M1 and a second capacitance element V2 are connected in parallel between lead-out region E and lead-out region F. Switch element M1 is a MISFET, and the second capacitance element V2 is a varactor. By this constitution, a LC type resonance circuit, which is constituted by the first portion and the second portion of the inductor L11 to L13, L21 to L23, capacitance elements V1, V2 and switch element M1, is formed. If switch element M1 is off, the capacitance of the second capacitance element V2, influences the resonance frequency of the resonator at OUTT, OUTB as in FIG. 1. However, if switch element M1 is on, it does not influence. That is, it is possible to switch the inductance and the capacitance at the same time by turning on/off of the switch as in FIG. 1. In this exemplary embodiment, it is also preferable that the constitutions, of the first portion and the second portion of the inductance element 1A, 1B and the positions of lead-out regions E, F are placed symmetrically so that the electrical characteristics at OUTT terminal and those at OUTB terminal are equivalent each other.

Sixth Exemplary Embodiment

FIG. 8 is a block diagram of an oscillation circuit according to a sixth exemplary embodiment. In FIG. 8, the number of lead-out regions provided in the first portion and the second portion 1A, 1B of the inductance element is increased and the number of the switch elements and the capacitance elements which are connected in parallel is increased than the oscillation circuit of the fifth exemplary embodiment described in FIG. 7. Lead-out regions H, I are provided in the first portion 1A of the inductance element, and lead-out regions J, K are provided in the second portion 1B of the inductance element. Furthermore, switch element M1 and a second capacitance element V21 are connected in parallel between lead-out region H and lead-out region K, and switch element M2 and a second capacitance element V22 are connected in parallel between lead-out region I and lead-out region J. Control signal LCNT1, LCNT2 are respectively connected to gates of switch elements M1, M2 which are constituted by MISFETs. The other constitutions are identical to the other exemplary embodiments. A LC type resonator, which is constituted by the first and second portions of the inductor element L11 to L15, L21 to L25, capacitance elements V1, V21 and V22, switch elements M1, M2, is formed by the above-mentioned constitution. The case in which switch elements are two elements M1, M2 is described. However, the constitution in which more than or equal to three switch elements exist can also be manufactured.

If switch M1 and M2 are off, the capacitances V21, V22 influence the resonance frequency of the resonator at OUTT, OUTB as in FIG. 1. However, if M1 is on, V21 does not influence, and if M2 is on, V22 does not influence. Both M1 and M2 may be on, and four states of the inductance and the capacitance by the combination of M1 and M2 can be realized. In this exemplary embodiment, it is also preferable that the constitutions of portions 1A, 1B of inductance element and the positions of lead-out regions H, K and I, J are placed symmetrically so that the electrical characteristics at OUTT terminal and those at OUTB terminal are equivalent each other.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A resonance type oscillation circuit comprising:
   an inductance element which is connected between a first terminal and a second terminal; an amplifier circuit which is connected in parallel with said inductance element between said first terminal and said second terminal;
   a first capacitance element which is connected between said first terminal and said second terminal;
   a pair of lead-out regions which are provided on a way of one end and an other end of said inductance element;
   a switch element which is connected between said pair of lead-out regions and provides a short-circuit between said pair of lead-out regions when said switch element is on; and
   a second capacitance element which is connected in parallel with said switch element between said pair of lead-out regions.

2. The oscillation circuit according to claim 1, wherein said inductance element comprises a first portion and a second portion connected in parallel between said first terminal and said second terminal.

3. The oscillation circuit according to claim 1, wherein said inductance element and said pair of lead-out regions are placed symmetrically so that electrical characteristics at said first terminal and those at said second terminal are equivalent to each other whether said switch element is on or off.

4. The oscillation circuit according to claim 1, further comprising:
a plurality of pairs of said lead-out regions. each of said lead-out regions provided on the way of the one end and the other end of said inductance element;
a plurality of said switch elements, each of said switch elements connected between a corresponding one pair of said plurality of pairs of lead-out regions; and
a plurality of said second capacitance elements, each of said second capacitance elements connected between a corresponding one pair of said plurality pairs of lead-out regions in parallel with a corresponding one of said plurality of said switch elements,
wherein said inductance element and each of said plurality of pairs of lead-out regions are placed symmetrically so that electrical characteristics at said first terminal and those at said second terminal are equivalent to each other whether any of said plurality of switch elements are on or off.

5. The oscillation circuit according to claim 1, wherein one of said pair of lead-out regions is provided at an end of said inductance element.

6. The oscillation circuit according to claim 2, wherein said pair of lead-out regions comprise:
a first lead-out region provided on a way of one end and an other end of said first portion of said inductance element; and
a second lead-out region provided on a way of one end and an other end of said second portion of said inductance element.

7. The oscillation circuit according to claim 2, further comprising:
a plurality of pairs of said lead-out regions, each said pair of said lead-out regions including:
a first lead-out region provided on a way of one end and an other end of said first portion of said inductance element; and
a second lead-out region provided on a way of one end and an other end of said second portion of said inductance element;
a plurality of said switch elements, each of said switch elements connected between a corresponding one pair of said plurality pairs of lead-out regions, and a plurality of said second capacitance elements connected between a corresponding one pair of said plurality pairs of lead-out regions in parallel with a corresponding one of said plurality of said switch elements.

8. The oscillation circuit according to claim 1, wherein at least one capacitance value of said first and second capacitance elements is variable.

9. A semiconductor device comprising:
a semiconductor substrate; and
a resonance type oscillation circuit formed on said semiconductor substrate,
wherein said oscillation circuit comprises:
an inductance element which is connected between a first terminal and a second terminal;
an amplifier circuit which is connected in parallel with said inductance element between said first terminal and said second terminal;
a first capacitance element which is connected between said first terminal and said second terminal;
a pair of lead-out regions which are provided on a way of one end and an other end of said inductance element;
a switch element which is connected between said pair of lead-out regions and provides a short-circuit between said pair of lead-out regions when said switch element is on; and
a second capacitance element which is connected between said pair of lead-out regions in parallel with said switch element.

10. The semiconductor device according to claim 9, wherein said second capacitance element comprises a p-n junction capacitance which is formed in said semiconductor substrate.

11. The semiconductor device according to claim 9, wherein said switch element comprises a MISFET.

12. The semiconductor device according to claim 9, wherein said second capacitance element comprises a p-n junction capacitance which is formed in a source/drain region of a MISFET.

13. The semiconductor device according to claim 12, wherein said MISFET is formed on a surface of a well which is provided on a surface of the semiconductor substrate, and a capacitance value of said second capacitance element is made variable by controlling a voltage potential of said well.

14. The semiconductor device according to claim 9, wherein said inductance element comprises a first portion and a second portion connected in parallel between said first terminal and said second terminal.

15. The semiconductor device according to claim 9, wherein said inductance element and said pair of lead-out regions are placed symmetrically so that electrical characteristics at said first terminal and those at said second terminal are equivalent to each other whether said switch element is on or off.

16. The semiconductor device according to claim 9, wherein said oscillation circuit further comprises:
a plurality of pairs of said lead-out regions, each of said lead-out regions provided on the way of the one end and the other end of said inductance element;
a plurality of said switch elements, each of said switch elements connected between a corresponding one pair of said plurality pairs of lead-out regions, and a plurality of said second capacitance elements, each of said second capacitance elements connected between a corresponding one pair of said plurality pairs of lead-out regions in parallel with a corresponding one of said plurality of said switch elements,
wherein said inductance element and each of said plurality of pairs of lead-out regions are placed symmetrically so that electrical characteristics at said first terminal and those at said second terminal are equivalent to each other whether any of said plurality of switch elements are on or off.

17. The semiconductor device according to claim 9, wherein one lead-out region of said pair of lead-out regions is provided at an end of said inductance element.

18. The semiconductor device according to claim 14, wherein said pair of lead-out regions comprise:
- a first lead-out region provided on a way of one end and an other end of said first portion of said inductance element; and
- a second lead-out region provided on a way of one end and an other end of said second portion of said inductance element.

19. The semiconductor device according to claim 14, further comprising:
- a plurality of pairs of said lead-out regions, each said pair of said lead-out regions including;
  - a first lead-out region provided on a way of one end and an other end of said first portion of said inductance element; and
  - a second lead-out region provided on a way of one end and an other end of said second portion of said inductance element;
- a plurality of said switch elements, each of said switch elements connected between a corresponding one pair of said plurality pairs of lead-out regions; and
- a plurality of said second capacitance elements connected between a corresponding one pair of said plurality pairs of lead-out regions in parallel with a corresponding one of said plurality of said switch elements.

* * * * *